(12) United States Patent
Ross

(10) Patent No.: US 7,016,249 B2
(45) Date of Patent: Mar. 21, 2006

(54) REFERENCE VOLTAGE GENERATOR

(75) Inventor: Jason M. Ross, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 307 days.

(21) Appl. No.: 10/611,278

(22) Filed: Jun. 30, 2003

(65) Prior Publication Data
US 2004/0268161 A1    Dec. 30, 2004

(51) Int. Cl.
*G11C 5/14* (2006.01)
(52) U.S. Cl. .................... 365/226; 365/189.09
(58) Field of Classification Search ........... 365/226, 365/189.09, 230.03
See application file for complete search history.

(56) References Cited

U.S. PATENT DOCUMENTS

| | | | | |
|---|---|---|---|---|
| 4,459,686 A | * | 7/1984 | Toyoda | 365/201 |
| 4,498,040 A | * | 2/1985 | Tatsushi et al. | 365/185.17 |
| 5,307,315 A | * | 4/1994 | Oowaki et al. | 365/189.09 |
| 5,875,146 A | * | 2/1999 | Itou | 365/226 |
| 6,052,325 A | * | 4/2000 | Merritt | 365/226 |
| 6,307,801 B1 | * | 10/2001 | Ogawa et al. | 365/226 |
| 6,314,028 B1 | * | 11/2001 | Kono | 365/189.09 |
| 6,449,669 B1 | | 9/2002 | Dahlen et al. | |
| 2001/0042216 A1 | | 11/2001 | Tae-Sung et al. | |
| 2002/0105837 A1 | | 8/2002 | Do-Geun et al. | |
| 2003/0080795 A1 | | 5/2003 | Takeo et al. | |

OTHER PUBLICATIONS

Notification of Transmittal of the International Search Report and the Written Opinion of the International Searching Authority, or the Declaration, PCT/US2004/020202, May 13, 2005.

* cited by examiner

*Primary Examiner*—Tan T. Nguyen
(74) *Attorney, Agent, or Firm*—Blakely, Sokoloff, Taylor & Zafman LLP

(57) ABSTRACT

Voltage differences between memory module power sources and memory controller power sources are corrected for when interpreting data signals passed between memory modules and a controller. Correction is provided by the reference voltage generated from the memory module or controller power source voltage so that if the voltage amplitude of a data signal transmitted by the memory module or controller varies due to changes in the power source voltage, the reference signal voltage amplitude will correspondingly vary. Thus, the data signal receiving controller or memory module can use the reference signal to properly interpret the voltage amplitude of data received.

34 Claims, 7 Drawing Sheets

REFERENCE VOLTAGE GENERATOR

FIELD

Electronic signal reference voltage.

BACKGROUND

Electronic systems, such as systems including analog and digital data signals, often involve a reference signal used to interpret the data signals. For example, a receiver of a digital data signal may use a reference signal having a constant voltage amplitude to interpret the digital data signal. Moreover, the receiver of the data signal may use a reference voltage generated from a local power source to interpret the data signal received from a data transmitter powered from another power source.

BRIEF DESCRIPTION OF THE DRAWINGS

Various features, aspects and advantages will become more thoroughly apparent from the following detailed description, the claims, and accompanying drawings in which:

DETAILED DESCRIPTION

Various embodiments of the invention relate to a data transmitter providing a reference voltage to a data receiver to ensure proper interpretation of the data received from the transmitter by the receiver. For example, a power source node that provides power to a data transmitter and that receives voltage from a power source may be coupled to a reference voltage generator that generates a reference voltage. Thus, a receiver of the data transmitted by the data transmitter may also receive the reference voltage to ensure proper interpretation of the data received. In addition, according to embodiments, the data transmitter may have a data storage unit, and the data receiver may have a controller for controlling the data storage unit.

Figure 1:
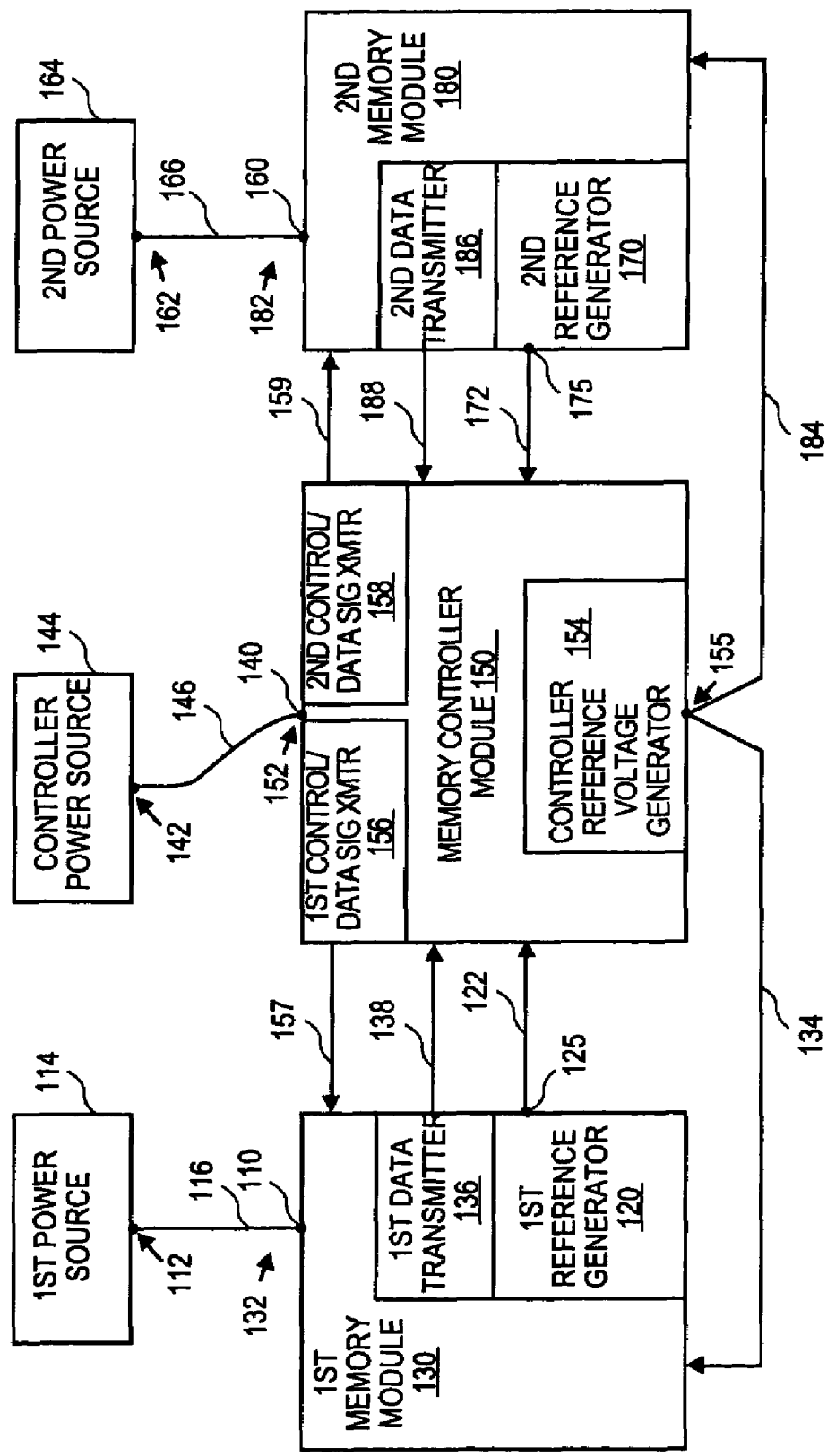
FIG. 1 is a block diagram of a first and second memory module, and a memory controller module, each having a power source, reference generator, and signal transmitter, according to one embodiment of the invention.

Specifically, for example, FIG. 1 is a block diagram of a first and second memory module, and a memory controller module, each having a power source, reference generator, and signal transmitter, according to one embodiment of the invention. FIG. 1 shows first power source node 110 to receive first voltage 112 via first voltage coupling 116 from first power source 114. First reference voltage generator 120 generates first reference voltage 125 when first voltage 112 is applied to first power source node 110. First memory module 130 is coupled via first voltage coupling 116 to receive power from first power source at 132.

Controller power source node 140 to receive controller voltage 142 from controller power source 144 via controller voltage coupling 146. Memory controller module 150 is coupled to receive power from controller power source node 152, and is coupled to first reference voltage generator 120 via first reference voltage coupling 122 to correct for a voltage difference between first power source 114 and controller power source 144 (e.g., such as a voltage difference between power 132 received at node 110 and power 152 received at node 140).

FIG. 1 also shows second power source node 160 to receive second voltage 162 from second power source 164 via second voltage coupling 166. Second reference voltage generator 170 generates second reference voltage 175 when second voltage 162 is applied to second power source node 160. Second memory module 180 is coupled to receive power from second power source node 182. In addition, memory controller module 150 is also coupled to second reference voltage generator 170 via second reference voltage coupling 172 to correct for voltage difference between second power source 164 and controller power source 144 (e.g., such as to correct for voltage difference between power 182 at node 160, and power 152 at node 140). Although nodes 110, 140, and 160 are shown attached to modules 130, 150, and 180, in embodiments, those nodes may be located externally to the modules, internally to the modules, or otherwise as appropriate for receiving voltage and/or power from a power source. Also, although couplings 116, 146, and 166 are shown providing voltages 112, 142, and 162 at nodes 110, 140, and 160, as well as providing power 132, 152, and 182, in embodiments, each of those couplings may include one or more lines, circuit board traces (e.g., such as the conductive signal traces on a circuit card or circuit board), power planes, contacts, connections, interconnections, vias, plated through-holes, buses, wires and/or other power couplings to provide the associated voltages and/or power.

Likewise, FIG. 1 shows controller reference voltage generator 154 to generate controller reference voltage 155 when controller voltage 142 is applied to controller power source node 140. Consequently, first memory module is coupled to controller reference voltage generator 154 via controller to first module reference voltage coupling 134 to correct for a voltage difference between controller power source 144 and first power source 114 (e.g., such as to correct for a voltage difference between power 152 at node 140 and power 142 at node 110). Similarly, second memory module 180 is coupled to controller reference voltage generator 154 via controller to second module reference voltage coupling 184 to correct for voltage difference between controller power source 144 and second power source 164 (e.g., such as to correct for a voltage difference between power 152 at node 140, and power 182 at node 160). In embodiments, couplings 122, 172, 138, 188, 157, 159, 134, and/or 184 may include electronic signal lines, circuit board traces, contacts, connections, interconnections, vias, plated through-holes, buses, buses, wires, and/or other signal couplings to provide the associated signals and/or voltages described above.

Figure 2:
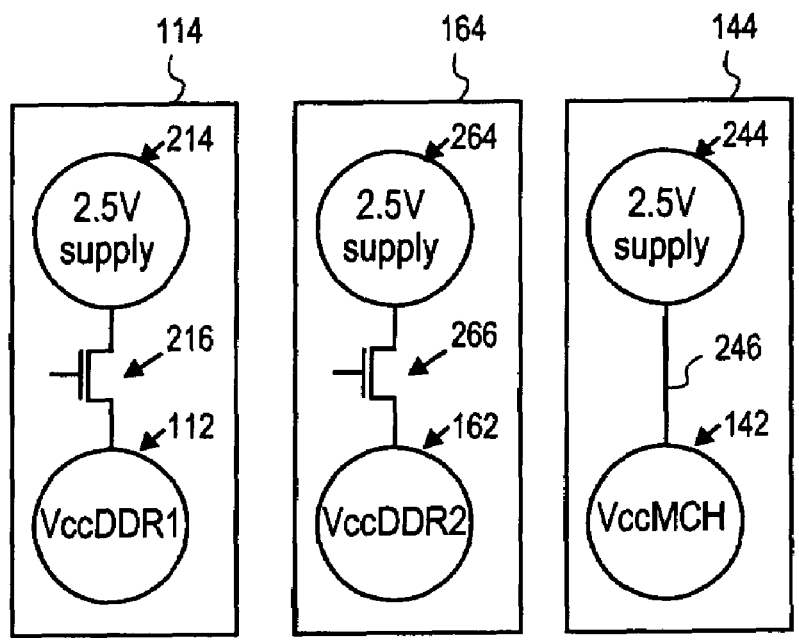
FIG. 2 is a block diagram of the first and second power source, and controller power source each containing an independent power supply, in accordance with one embodiment of the invention.

Moreover, according to embodiments, power source 114, 144, and/or 164 may include or be power supplies which may or may not be connected to modules 130, 150, and/or 180 via switches. For example, FIG. 2 is a block diagram of the first and second power source, and controller power source each containing an independent power supply, in accordance with one embodiment of the invention. FIG. 2 shows first power source 114 including 2.5 volt power supply 214 coupled via first switch 216 to supply first voltage 112. First switch 216 may include appropriate electronic switch components to connect and disconnect power and/or power supply voltage to be provided at voltage 112 and/or power 132. Similarly, second power source 164 includes second power supply 264 coupled via second switch 266 to provide second voltage 162. Moreover, controller power source 144 includes controller power supply 244 coupled via controller power supply to controller voltage coupling 246 to provide controller voltage 142. Coupling 246 may or may not include a switch similar to switch 216 described above.

Examples of sufficient switches for switch 216 and switch 266 include: transistors; mechanical switches; computer controlled switches; integrated circuit switches; diodes; silicon devices; and other electronic devices and/or circuitry capable of connecting and disconnecting power and/or voltage at 112 (e.g., such as by creating an open circuit, or short circuit across the switch). Moreover, according to embodiments, switch 216 and switch 266 may provide sufficient functionality to support memory hot swap (e.g., such as hot swap with respect to module 130 and/or module 180).

Figure 3:
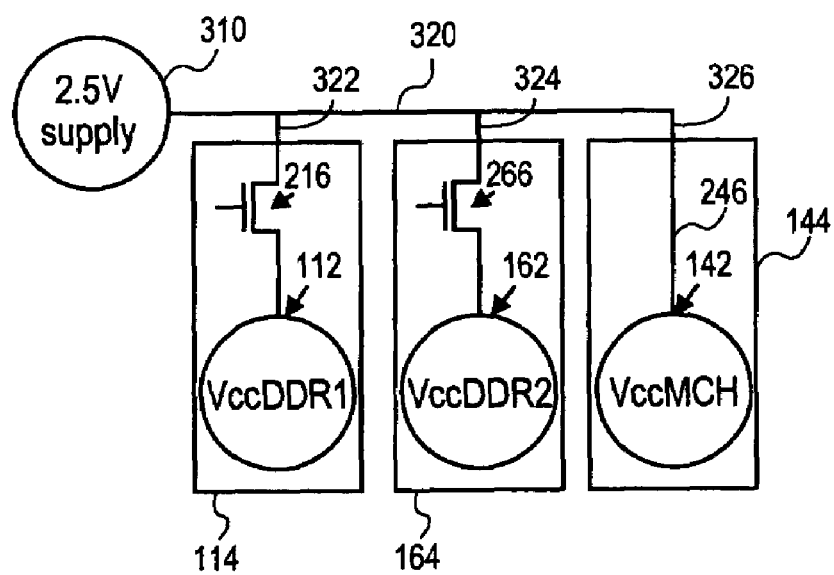
FIG. 3 is a block diagram of the first and second power source, and controller power source, each powered from a common power supply, in accordance with one embodiment of the invention.

On the other hand, according to embodiments, two or more of the power sources may receive power from a common supply of power. For example, FIG. 3 is a block diagram of the first and second power source, and controller power source, each powered from a common power supply, in accordance with one embodiment of the invention. FIG. 3 shows common supply of power 310 (e.g., such as a 2.5 volt power supply) coupled to first source 114 via common supply to first source coupling 322, coupled to second source 164 via common supply to second source coupling 324, and coupled to controller source 144 via common supply to controller source coupling 326. According to embodiments, couplings 322, 324, and 326 may be electrically independent of each other, or may include common electronic pathways such as shown by common coupling 320 (e.g., such as a power bus). As shown in FIG. 3, coupling 322 couples source 310 to switch 216, coupling 324 couples source 310 to switch 266, and coupling 326 couples source 310 to coupling 246.

Although supplies 214, 244, 264, and source 310 are shown in FIGS. 1 and 2 as 2.5 volt supplies, according to embodiments, those supplies or sources may be various other power supplies or sources sufficient to provide independent or dependent power having voltages 112, 162, and 142 in a range between −12 and +12 volts. In many cases, voltages 112, 162, and 142 may each vary independently, due to circuitry associated with those voltages (e.g., such as due to the on-resistance of transistor switch 216 and switch 266) in a range between 1.5 and 2.9 volts.

Furthermore, in embodiments, some or all of the electronic components, circuitry, and/or power supplies and sources shown in FIGS. 1, 2, and 3 may be part of a circuit board. For example, some or all of the components of FIGS. 1 and 3 may be provided by circuit board power planes, electronic traces, power bus traces, signal traces, transistor switches, resisters, capacitors, and inductors.

More particularly, power source voltage (e.g., such as voltages 112, 142, and 162) tend to vary in amplitude with time for a number of reasons, including: (1) due to the use of independent power supplies (e.g., such as supplies 214, 264, and 244 as shown in FIG. 2); (2) due to resistance and/or power drain in circuitry associated with providing power from supplies or sources (e.g., such as due to switches 216 and 266, circuit board power planes, electronic traces, power bus traces, signal traces, transistor switches, resisters, capacitors, and inductors, and/or electronic couplings such as shown in FIGS. 2 and 3); and/or (3) due to power voltage drop or droop resulting from demands for power by modules consuming the power (e.g., such as power consumption by module 130, 150, and 180). For example, power supplies 214, 264, and 244 may nominally be 2.5 volts. However, due to differences in the voltage provided by supplies 214, 264, and 244, as well as the electronics coupling those supplies to provide voltages 112, 162, and 142, and the consumption of power by modules 130, 150, and 180, the actual voltage supplied at each of voltage 112, 162, and 142 may have an amplitude that varies independently with time within a voltage tolerance window (e.g., such as a power supply voltage tolerance). Similarly, although source 310 may nominally be 2.5 volts and ultimately provides voltage 112, 162, and 142. However, due to the electronics coupled between source 310 and voltages 112, 162, and 142, the amplitude of each of those voltages may also vary independently from each other with respect to time.

Figure 4:
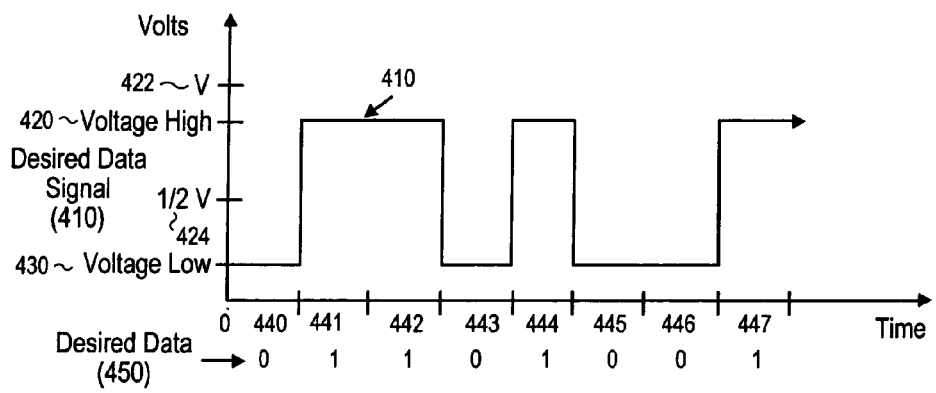
FIG. 4 is a signal diagram of a desired data signal, in accordance with one embodiment of the invention.

Such variances in power source voltage can have a detrimental effect on data transmission, as well as interpretation of that received data. For example, FIG. 4 is a signal diagram of a desired data signal, in accordance with one embodiment of the invention. FIG. 4 shows desired data signal 410 having a voltage amplitude between voltage low 430 and voltage high 420 over time intervals 440 through 447. For instance, signal 410 may be a binary digital signal for providing desired data 450 (e.g., 0-1-1-0-1-0-0-1). More particularly, time intervals where the voltage amplitude of signal 410 averages below ½ V-volts 424 are interpreted as a logical "0", while time intervals where the voltage amplitude of signal 410 averages greater than ½ V-volts 424 are interpreted as a logical "1" (e.g., a logical "0" is the intended interpretation of a low voltage data signal, and a logical "1" is the intended interpretation of a high voltage signal). Thus, signal 410 may be a signal that first data transmitter 136 desires to provide via coupling 138 to communicate data 450 to module 150.

Figure 5:
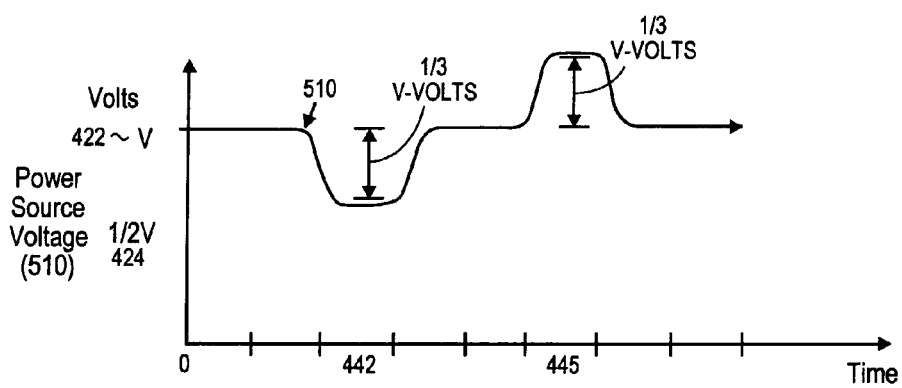
FIG. 5 is a signal diagram of a power source voltage, in accordance with one embodiment of the invention.

However, due to the electronics, circuitry, and line loss of module 130, transmitter 136, and other components associated with power 132 and voltage 112 (e.g., such as for providing voltage 112, as described above with respect to FIGS. 2 and 3); power source voltage (e.g., such as voltage at node 110) may vary with time. For instance, FIG. 5 is a signal diagram of a power source voltage, in accordance with one embodiment of the invention. FIG. 5 shows power source voltage 510 having nominal power voltage amplitude V-volts 422, but varying in amplitude with time. Specifically, signal 510 drops in amplitude from V-volts to an amplitude during interval 442 that is on the average less than ⅔ V-volts. At interval 445 signal 510 increases to an amplitude on the average greater than ⅓ V-volts.

Figure 6:
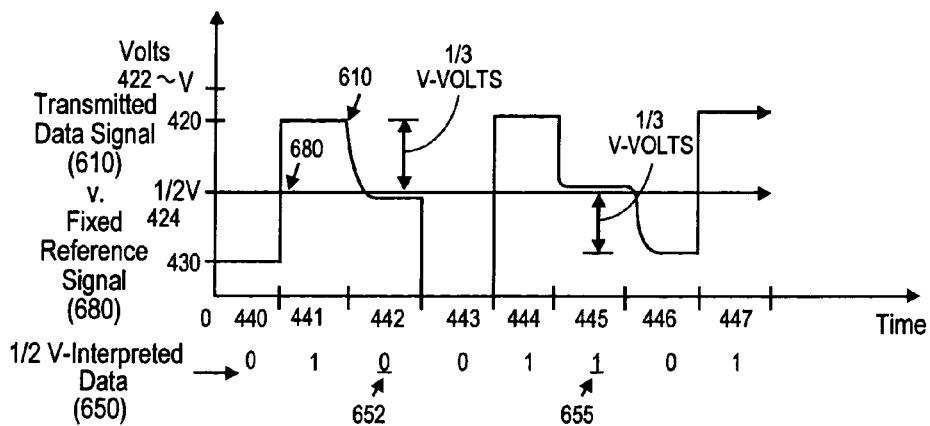
FIG. 6 is a signal diagram of a transmitted data signal and a constant voltage amplitude reference signal, in accordance with one embodiment of the invention.

Fluctuations in power source voltage amplitude can affect the voltage amplitude of a data signal data transmitted by a data transmitter module. For example, the actual data signal transmitted by transmitter 136 may have a voltage amplitude different from desired data signal 410. Specifically, if the amplitude of voltage at 110 varies with time, the amplitude of signal 410 may also vary with time (e.g., such as by being dependent to, proportional to and/or tracking the voltage amplitude of signal 112 over time). More particularly, FIG. 6 is a signal diagram of a transmitted data signal and a constant voltage amplitude reference signal, in accordance with one embodiment of the invention. FIG. 6 shows transmitted data signal 610 having a voltage amplitude corresponding to desired data signal 410 as produced and/or transmitted by a device (e.g., such as by a data transmitter module) receiving power having power source voltage amplitude 510. Thus, during intervals 442 and 445, the voltage amplitude of signal 610 may track the voltage amplitude of signal 510. Specifically, although signal 410 is at voltage 420 during interval 442, signal 610 has an amplitude reduced by voltage ⅓ V-volts during interval 442 corresponding to and tracking the drop or droop of signal 510 during interval 442 with time. Similarly, the amplitude of signal 410 during time interval 445, as affected by the amplitude of signal 510 during that same period of time, results in signal 610 during time interval 445. Notably, although signal 410 has high voltage amplitude 420 on the average during interval 442 and low voltage amplitude 430 on the average during interval 445, signal 610 has a voltage amplitude less than ½ V-volts 424 during interval 442 and greater than ½ V-volts 424 on the average during interval 445. Thus, if signal 610 is compared with a fixed or constant voltage reference signal having a voltage amplitude of ½ V-volts, or any reference voltage having an amplitude of approximately ½ V-volts during interval 442 and interval 445, signal 610 may be misinterpreted.

For instance, FIG. 6 shows signal 610 having a voltage amplitude that is on the average less than ½ V-volts during interval 442. Thus, a comparison between signal 610 and reference signal 680 could result in signal 610 being interpreted as a voltage low 430 during interval 442 such as is shown by the logical "0" at bit location 652 of ½ V-volts reference interpreted data 650. Similarly, a comparison between signal 610 and reference signal 680 could result in signal 610 being interpreted as a voltage high 420 during interval 445, such as is shown by the logical "1" at bit location 655 of ½ V-volts reference interpreted data 650. Moreover, it is contemplated that reference signal 680 may not be a fixed or constant voltage, but may fluctuate with time. For instance, the power source voltage and/or circuitry involved in providing signal 680 could produce a reference signal voltage amplitude that fluctuates over time (e.g., such as if the power source voltage used to provide signal 680 had a voltage amplitude of that fluctuated from nominal volts 422 with polarity opposite to that as shown by signal 510, thus resulting in the voltage amplitude of signal 680 varying with opposite polarity to that of the variance shown by the voltage amplitude of signal 610).

According to embodiments, a comparison between the data signal voltage amplitude and a reference signal voltage amplitude (e.g., such as a comparison between signal 610 and signal 680) can be provided by various electronic components and circuitry including a voltage comparator circuit, a differential input buffer, transistors, silicon devices, integrated circuits, resistors, capacitors, and inductors.

For example, if transmitter 136 transmitted signal 410 to module 150, but module 150 interprets the data with a reference signal produced by dividing voltage 142 in half, and voltage 142 has a voltage amplitude varying from V-volts 422 with polarity opposite to that shown for signal 510, then data 410 may also be misinterpreted. Specifically, during interval 442 the voltage amplitude of the reference signal may be increased to be on the average greater than the voltage amplitude of signal 410, and during interval 445 the voltage amplitude of the reference signal may be decreased to be on the average lower than the voltage amplitude of signal 410 during interval 445. Thus, the same misinterpretation at bit location 652 and 655 may result, even though the desired data signal 410 is sent. Thus, signal 510 may represent voltage 112, signal 660 may represent data transmitted by transmitter 136, and reference 680 may represent one-half voltage 142.

Likewise, to the description for power supply 214 and voltage 112, as described above, in FIGS. 4–8, V-volts 422 may be in a range between −12 and +12 volts so that corresponding voltages shown, such as ½ V-volts, ⅓ V-volts, voltage 420, and voltage 430, are in proportion to V-volts. In many cases, V-volts may be in a range between 1.5 and 2.9 volts.

Figure 7:
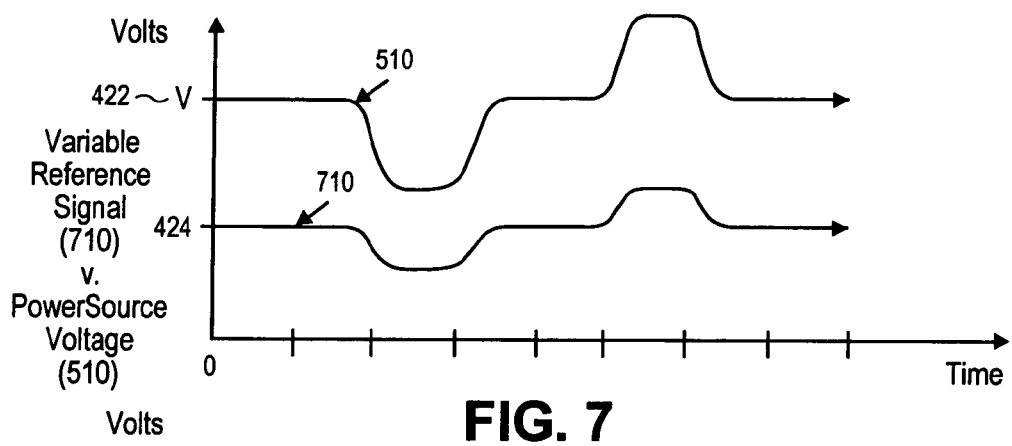
FIG. 7 is a signal diagram of a reference signal having a variable voltage amplitude that is proportional over time to a power source voltage having a varying voltage amplitude, in accordance with one embodiment of the invention.

According to embodiments of the invention, a data receiver receiving data from a data transmitter may also receive a first reference voltage from the data transmitter to ensure proper interpretation of the data received. For example, FIG. 7 is a signal diagram of a reference signal having a variable voltage amplitude that is proportional over time to a power source voltage having a varying voltage amplitude, in accordance with one embodiment of the invention. FIG. 7 shows variable reference signal 710 having a voltage amplitude proportional with the voltage amplitude of power source voltage 510 over time. For example, the voltage amplitude of signal 710 may be on the order of approximately one-half of the voltage amplitude of signal 510.

Although FIG. 7 shows a reference signal having a voltage amplitude proportional over time to the power source voltage, in embodiments, the reference signal voltage may track the power source voltage in accordance with relationships or associations other than proportionality. For example, the reference signal may be a signal derived from the power source voltage via electronic circuitry and components such as passive device or circuit, a plurality of resisters, a plurality of capacitors, a plurality of inductors, or some other voltage reduction mechanism. Thus, the effects of changes in the power source voltage may be delayed or otherwise transformed to increase or decrease the reference voltage amplitude so that the reference voltage amplitude increases or decreases more accurately correspond in time with similar effects from the power source voltage amplitude over time. Moreover, in embodiments, the reference source voltage amplitude may not be proportional with the power source voltage amplitude, such as being inversely proportional, including a modulated frequency, being a rectified voltage, being a derivative signal, or being an integrated signal.

Figure 8:
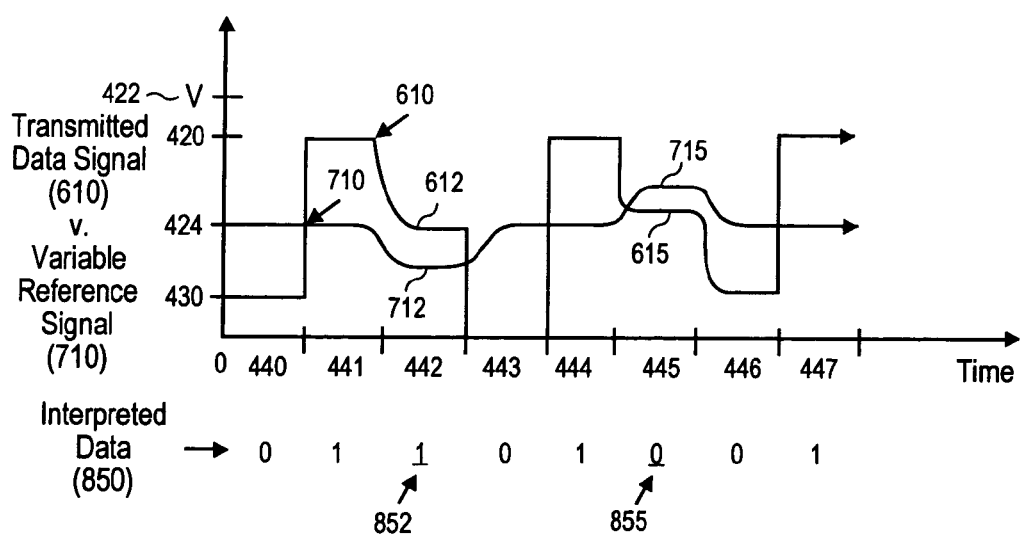
FIG. 8 is a signal diagram of a transmitted data signal and a variable voltage amplitude reference signal that is proportional to the power source voltage of the transmitter, in accordance with one embodiment of the invention.

According to embodiments, a variable reference signal, such as signal 710, may be used to correct for a voltage difference between the power source voltage of a data transmitter module and the power source voltage of a data receiver module by using signal 710 as a reference voltage instead of a reference signal generated from the data receiver's power source voltage. For example, FIG. 8 is a signal diagram of an actual data signal as compared to a reference signal having a variable voltage amplitude that is proportional to a varying power source voltage, in accordance with one embodiment of the invention. FIG. 8 shows transmitted data signal 610 compared to variable reference signal 710, where both signal 610 and signal 710 are effected by variances in power source voltage 510 voltage amplitude, as described above with respect to FIGS. 5-7. At interval 442, the ⅓ V-volts decrease in voltage amplitude of signal 510 decreases the voltage amplitude of signal 610, as well as signal 710, as shown at amplitude 612 and amplitude 712. Thus, signal 710 can be used as a voltage reference to ensure proper interpretation of data received via signal 610. Moreover, at interval 445, the voltage amplitude of signal 610 is on the average less than the voltage amplitude of signal 710, as shown by amplitude 615 as compared to amplitude 715. As a result, although power source voltage 510 fluctuates by as much as ⅓ V-volts during intervals 442 and 445, data signal 610 is properly interpreted, as shown by the logical "1" at bit location 852 and the logical "0" at bit location 855 of transmitted data signal as compared to variable reference signal interpretation 850 which corresponds to desired data 450 (e.g., desired data 450 is 0-1-1-0-1-0-0-1, and interpreted data 850 is also 0-1-1-0-1-0-0-1).

Although in FIGS. 4–8 power source variances of ⅓ V-volts are described, according to embodiments, power source voltage variances may be less than ⅓ V-volts, such as variations of plus or minus five percent of nominal voltage V-volts. Moreover, although voltage low 430 is shown as approximately ⅙ V-volts, and voltage high 420 is shown as approximately ⅚ V-volts in FIGS. 4–8, according to embodiments, voltage low 430 (e.g., such as a voltage low nominal voltage for data or control signals) and voltage high 420 (e.g., such as a voltage high nominal voltage for data or control signals) may be voltages in a range further from or closer to the reference voltage for interpreting an incoming signal (e.g., such as voltage 424 shown as ½V volts in FIGS. 4–8). Furthermore, although voltage 424 is shown as ½V volts in FIGS. 4–8, voltage 424, voltage 680, and/or voltage 710 could nominally be any fraction of voltage 422 V-volts.

For instance, although FIGS. 4–8 show reference signal 680 and 710 as a singular reference voltage signal for interpreting data signal 610, according to embodiments, incoming data or control signals (e.g., such as signal 610) may be interpreted according to a voltage high threshold and a voltage low threshold associated with the reference signal (e.g., such as associated with reference signal 680 or 710). Thus, incoming data or control signals (e.g., such as signal 610) can be interpreted by identifying any portions of the incoming signal above a voltage high threshold as a voltage high, any portions of the incoming data or control signal below the voltage low threshold as a voltage low, and any portions of the incoming data or control signal that is between the voltage high threshold and the voltage low threshold as an intermediate. Note that in one embodiment, although portions of signals identified as intermediates are tolerated, such as during transition of the incoming signal from a voltage high to a voltage low, extended periods of an incoming signal being interpreted as an intermediate may lead to the receiver identifying a bit that could be interpreted as either a voltage high or a voltage low. Moreover, such an interpretation ambiguity may lead to data or control signal interpretation errors, and memory errors.

Specifically, for example, a voltage high threshold may be selected to be the voltage amplitude of the reference signal (e.g., such as reference signal 680 or 710) plus 125 milli-Volts (mV); and a voltage low threshold may be selected to be the voltage amplitude of the reference signal (e.g., such as reference signal 680 or 710) minus 125 mV. Thus, in a system such as described herein with respect to FIGS. 1–3 and 9–11, according to embodiments, a data or control signal having a voltage high nominal voltage of the reference voltage plus 175 mV, and/or a voltage low nominal voltage of the reference voltage minus 175 mV may be interpreted as indeterminant if the actual data or control signal (e.g., such as signal 610) were to drop or droop from the voltage high nominal voltage by more than 50 mV, or were to increase above the voltage low nominal voltage by more than 50 mV respectively. Therefore, as described above with respect to variable reference signal 710 having a voltage amplitude proportional with the voltage amplitude of power source voltage 510 over time, according to embodiments of the invention, it is possible for a data or control signal receiver to receive a reference voltage from the data or control signal transmitter to ensure proper interpretation of the data or control signal received.

In accordance with one embodiment associated with FIGS. 4–8, for example, if signal 510 corresponds to voltage 112 and signal 610 corresponds to data transmitted by transmitter 136 via coupling 138, module 150 may also receive reference signal 710 from generator 120 via coupling 122. More particularly, module 150 may include a comparator module to interpret whether the voltage amplitude of data received (e.g., such as the amplitude of signal 610 provided via coupling 138) from a data transmitter 136, over a period of time, is greater than, or less than a voltage amplitude of a variable reference signal (e.g., such as the voltage amplitude of 710 provided via coupling 122) over the same period of time. Thus, module 150 may include various electrical components and circuitry, such as a differential input buffer, a voltage comparator circuit, transistors, resistors, capacitors, and inductors, as further described above to compare the voltage amplitude of a data signal (e.g., such as signal 610 from transmitter 136) to voltage amplitude of a reference signal (e.g., such as signal 710 transmitted via coupling 122).

In addition, module 150 can receive a variable reference signal from second reference generator 170 via coupling 172 to ensure proper interpretation of data sent from second data transmitter 186 via coupling 188. Thus, if voltage 162 and/or voltage 142 varies, such as by voltage amplitude amounts as great or greater than those described above with respect to signal 510 data from module 180 may still be interpreted properly by module 150. In other words, module 150 can be coupled to receive power 152 from controller power source node 140 and coupled to first reference voltage generator 120 to correct for voltage differences between power 132 and power 152, as well as be coupled to second reference voltage generator 170 to correct for voltage difference between second power 182 and power 152. Hence, regardless of how the voltage at node 110 and/or node 160 vary from the voltage at node 140, module 150 receives variable reference signals from generator 120, as well as generator 170 to interpret data transmitted by transmitter 136 and by transmitter 186 (e.g., such as by comparing the reference signal of a module with the data signal of that module, as described above with respect to FIG. 8) to ensure proper interpretation of the data from module 130 and module 180 (e.g., as opposed to a potential misinterpretation as shown above with respect to FIG. 6).

Similarly to a variable reference signal provided by generator 120 and generator 170, as described, controller reference voltage generator 154 may generate controller reference voltage 155 when voltage 142 is applied to node 140 so that modules 130 and 180 may receive voltage 155 via couplings 134 and 184 to correct for voltage differences between power 152, and power 132 and 182. Thus, for example, if voltage 142 varies similar to signal 510, data transmitted by module 150 to modules 130 and 180 may be interpreted properly. Specifically, first control/data signal transmitter 156 may transmit a first control signal or data signal via first control/data signal coupling 157 to first memory module 130, and second control/data signal transmitter 158 may transmit a second control signal or data signal via second control/data signal coupling 159 to second memory module 180. Moreover, first data transmitter 136 may transmit first data via first data coupling 138 to memory controller module 150, and second data transmitter 186 may transmit second data via second data coupling 188 to module 150. According to embodiments, first data may depend on first power source 114, such as by the amplitude of data transmitted by transmitter 136 tracking or being proportional to the voltage at power 132, similarly to the effect of signal 510 on signal 610, as described above. Likewise, second data transmitted by transmitter 186 may depend on second power source 164, first control signal or data signal transmitted by transmitter 156 may depend on controller power source 144, and second control signal or data signal transmitted by transmitter 158 may depend on controller power source 144, similarly to first data transmitted by transmitter 136 depending on power source 114, as described above. Consequently, although any of transmitter 136, 156, 158, and/or 186 desire to transmit a signal similar to signal 410, if at node 110, 140, and/or 160 they receive power source voltage similar to signal 510, the data actually transmitted may be similar to signal 610 which could be misinterpreted if compared with a set constant reference, such as signal 680, instead of compared to a variable reference signal similar to signal 710, as shown in FIG. 8.

Furthermore, in embodiments, because the data transmitted by module 130 depends on data or control received from module 150, if data or control received from module 150 is misinterpreted by module 130, the content of data sent by transmitter 136 back to module 150 may be erroneous (due to misinterpretation). Similarly, the content of data or control transmitted by transmitter 156 and transmitter 158 may depend on the interpretation of data received from module 130 and module 180. Also, the content of data transmitted by transmitter 186 may depend on the interpretation of data received from module 150. Thus, if reference voltages 125, 155, and 175 are provided to data signal recipients, the content of data transmitted in return by the data signal recipients will depend on those reference voltages and contain fewer errors. In other words, data errors that get introduced into the system by modules misinterpreting data may and tend to be propagated through the system to other modules.

Figure 9:
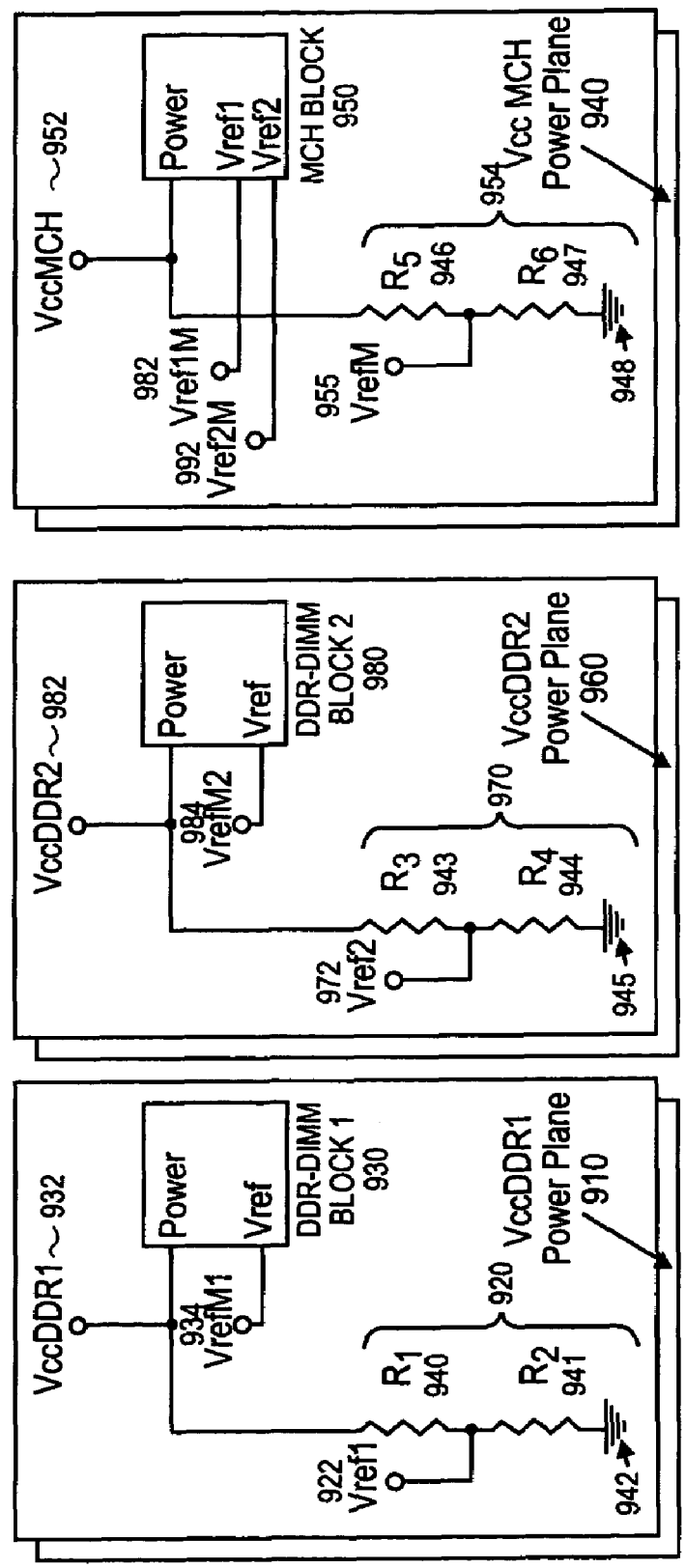
FIG. 9 is a schematic diagram of a first and second double data rate (DDR) random access memory (RAM), and memory controller (MCH) having voltage divider reference signal generators, and circuit board power planes, in accordance with one embodiment of the invention.

Moreover, in accordance with embodiments, memory modules, such as modules 130 and 180 may include various types of memory, such as RAM, double data rate RAM (DDRRAM), synchronous dynamic RAM (SDRAM), double data rate synchronous dynamic RAM (DDRS-DRAM), static RAM (SRAM), flash memory, as well as other types of synchronous and asynchronous memory as appropriate. For example, FIG. 9 is a schematic diagram of a first and second double data rate (DDR) random access memory (RAM), and memory controller (MCH) having voltage divider reference signal generators, and circuit board power planes, in accordance with one embodiment of the invention. FIG. 9 shows VccDDR1 node 932 coupled to power DDR dual in-line memory modules (DIMMs) block 1 930 and coupled to VccDDR1 power plane 910. VrefM1 node 934 is coupled to Vref of block 1 930. In addition, node 932 is coupled to reference generator 920 which is shown as a two resistor voltage divider having $R_1$ 940 coupled to Vref1 node 922 and $R_2$ 941. $R_2$ 941 is in turn coupled to first ground 942. Generator 920 is for dividing the voltage at node 932 to equal that voltage multiplied by $R_2$ divided by ($R_1$ plus $R_2$). Consequently, if the resistive value of $R_1$ equals the resistive value of $R_2$, Vref1 will supply a voltage equal to one-half that of the voltage provided at node 932. Although FIG. 9 shows reference generator 920 as a two resistor voltage divider, in embodiments, various other passive circuitry and electronic components can be used to provide voltage at Vref1 922, such as various passive circuits including resistors, capacitors, and inductors. Moreover, in embodiments, the voltage at Vref1 922 can be more or less than ½ the voltage at node 932 (e.g., such as is described above with respect to signal 710).

Similarly, FIG. 9 shows VccDDR2 node 982 coupled to power DDR DIMM block 2 980 and coupled to VccDDR2 power plane 960. VrefM2 node 984 is coupled to Vref of block 2 980. In addition, node 982 is coupled to reference generator 970 which is shown as a two resistor voltage divider having $R_3$ 943 coupled to Vref2 node 972 and $R_4$ 944. $R_4$ is in turn coupled to second ground 945. Generator 970 is for dividing the voltage at node 982 to equal that voltage multiplied by $R_4$ divided by ($R_3$ plus $R_4$). Consequently, if the resistive value of $R_3$ equals the resistive value of $R_4$, Vref2 will supply a voltage equal to one-half that of the voltage provided at node 982. Although FIG. 9 shows reference generator 970 as a two resistor voltage divider, in embodiments, various other passive circuitry and electronic components can be used to provide voltage at Vref2 972, such as various passive circuits including resistors, capacitors, and inductors. Moreover, in embodiments, the voltage at Vref2 972 can be more or less than ½ the voltage at node 982 (e.g., such as is described above with respect to signal 710).

In addition, FIG. 9 shows VccMCH node 952 is coupled to memory controller (MCH) block 950 and coupled to VccMCH power plane 940. For example, MCH block 950 may be a memory controller module for controlling a first and second memory modules (e.g., such as modules 130 and 180 or 930 and 980 via control signals such as from transmitters 156 and 158 via couplings 157 and 159). Vref1 M node 982 is coupled to Vref1 of block 950, and Vref2 M node 992 is coupled to Vref2 of block 950. In addition, node 952 is coupled to reference generator 954 which is shown as a two resistor voltage divider having $R_5$ 946 coupled to VrefM node 955 and $R_6$ 947. $R_6$ 947 is in turn coupled to MCH ground 948. Generator 954 is for dividing the voltage at node 952 to equal that voltage multiplied by $R_6$ divided by ($R_5$ plus $R_6$). Consequently, if the resistive value of $R_5$ equals to the resistive value of $R_6$, VrefM will supply a voltage equal to one-half that of the voltage provided at node 952. Although FIG. 9 shows reference generator 954 as a two resistor voltage divider, in embodiments, various other passive circuitry and electronic components can be used to provide voltage at VrefM 955, such as various passive circuits including resistors, capacitors, and inductors. Moreover, in embodiments, the voltage at VrefM 955 can be more or less than ½ the voltage at node 955 (e.g., such as is described above with respect to signal 710).

According to embodiments, planes, 910, 960, and/or 940 may be electronically separate planes on separate circuit board levels, separate planes geographically divided on the same circuit board level, or may be the same plane on the same circuit board level. Similarly, in embodiments, grounds, 942, 945, and/or 948 may be the same electronic ground, separate grounds, coupled to the same ground plane or coupled to various ground planes (e.g., such as planes in a configuration similar to that described above for planes 910, 960, and 940). Moreover, where any of planes 910, 960, and 940 are separate planes, they may be coupled together via electronic circuitry and components such as, switches, resistors, buses, traces, capacitors, vias, plated through-holes, inductors, and other types of couplings, as described above with respect to coupling 122.

Additionally, FIG. 9 may be circuit board embodiments of any of the structure shown or described with respect to FIGS. 1–3. Thus, supply 310 may be a circuit board power plane (e.g., such as a power plane including planes 910, 960, and 940) and coupling 320, 322, 324, and 326 may be electronic circuitry, switches, circuit board traces (e.g., such as traces for coupling plane 910 to node 932, plane 960 to node 982, and plane 940 to node 952), and other types of couplings, as described above with respect to coupling 122. Also, in embodiments, Vref1 922 may be coupled to Vref1M 982 such as via electronic circuitry, switches, vias, plated through-holes, circuit board traces, and other types of couplings, as described above with respect to coupling 122. Similarly, Vref2 972 may be coupled to Vref2M 992, VrefM1 934 may be coupled to VrefM 955, and VrefM 984 may be coupled to VrefM 955 such as via electronic circuitry, switches, circuit board traces, and other types of couplings, as described above with respect to coupling 122.

Figure 10:
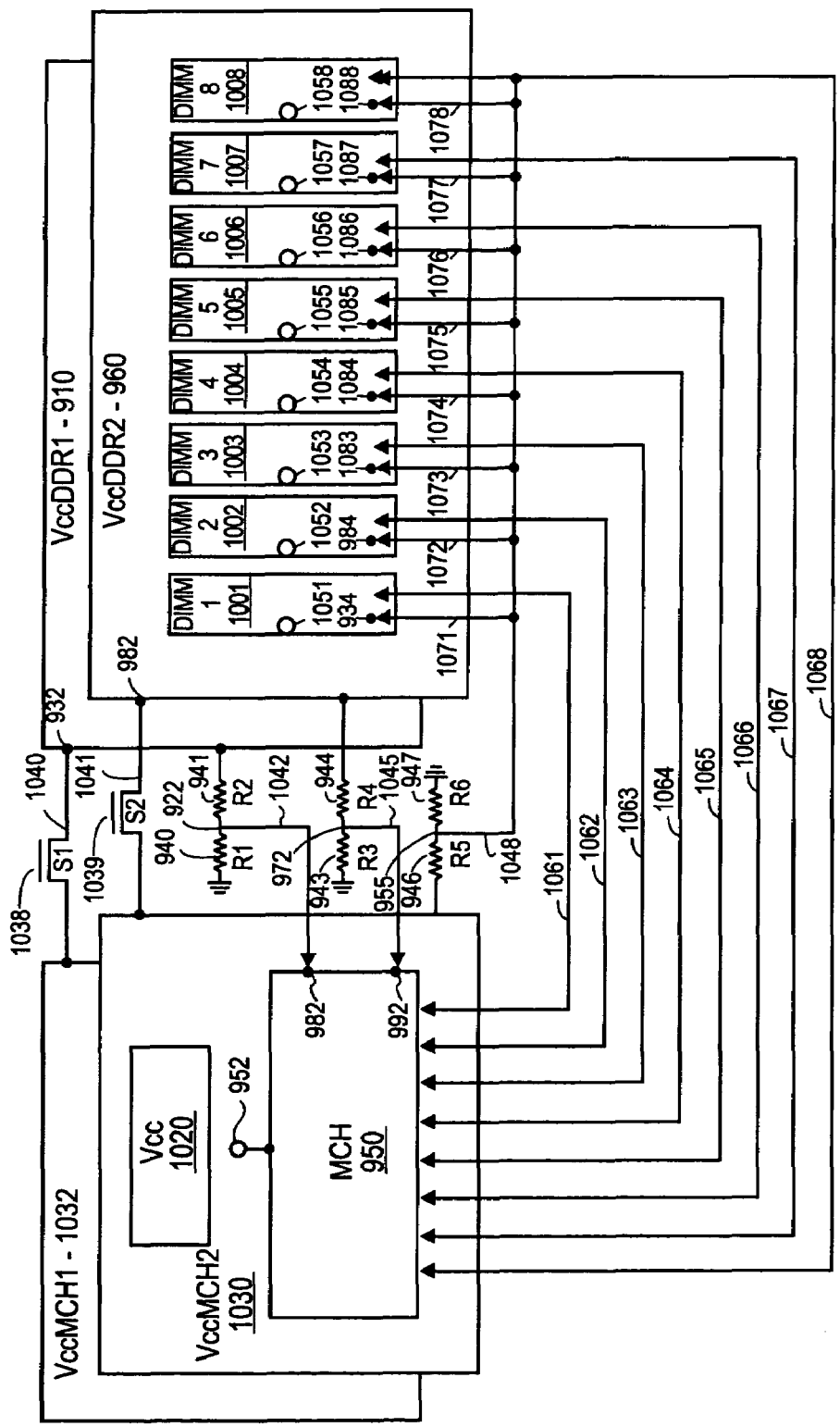
FIG. 10 is a schematic diagram of a first and second DDR circuit board power plane for supporting two sets of dual in-line memory modules (DIMMs) coupled by switches to two MCH circuit board power planes for powering a MCH to control the DIMMs, in accordance with one embodiment of the invention.

Additionally, according to embodiments, memory modules such as module 130, 180, 930, and/or 980 may be one or more DIMMs. For instance, FIG. 10 is a schematic diagram of a first and second DDR circuit board power plane for supporting two sets of dual in-line memory modules (DIMMs) coupled by switches to two MCH circuit board power planes for powering a MCH to control the DIMMs, in accordance with one embodiment of the invention. FIG. 10 shows VccMCH1 power plane at 1032 coupled via first switch 1038 and first switch coupling 1040 (e.g., such as a circuit board trace) to first power source node 932. Similarly, VccMCH1 power plane 1030 is coupled via second switch 1039 and second switch coupling 1041 (e.g., such as a circuit board trace) to second power source node 982. Switches 1038 and 1039 are switches to electrically connect and disconnect planes 1032 and 1030 to and from nodes 932 and 982. Sufficient switches for switches 1038 and 1039 include those described above, such as for switches 260 and 266. Although planes 1032 and 1030 are shown as separate planes in FIG. 10, in embodiments, planes 1030 and 1032 may be the same planes (e.g., such as plane 940 as described above). Vcc power source 1020 provides power to planes 1030 and 1032. For example, power source 1020 may be a source in accordance with source 144, supply 244 or supply 310 as described above. MCH 950 is coupled to plane 1030 and/or plane 1032 via node 952. According to embodiments couplings 1040, 1041 may be provided by electronic circuitry, component, power buses, interconnect, circuit board traces, wires, signal lines, and various other appropriate electronic couplings, as described above with respect to coupling 122. Voltage at node 932 provides power to VccDDR1 power plane 910, and voltage at node 982 provides power to VccDDR2 power plane 960.

Plane 910 is in turn coupled to $R_1$ 940 via $R_2$ 941 to provide Vref1 922. Vref1 922 is coupled via Vref1 coupling 1042 to Vref1M node 982. Plane 960 is coupled to $R_3$ 943 via $R_4$ 944 to provide Vref2 972. Vref2 972 is coupled via Vref2 coupling 1045 to Vref2M node 992. Likewise, plane 1030 is coupled to $R_6$ 947 via $R_5$ 946 to provide VrefM 955. VrefM 955 is coupled via VrefM coupling 1048 to each of DIMM1 through DIMM8. In embodiments, couplings, 1042, 1045, and 1048 are appropriate electronic couplings such as described above with respect to coupling 1040.

As shown in FIG. 10, DIMM1 through DIMM8 are each coupled either to VccDDR1 or VccDDR2 for power, each receive VrefM, and are each coupled via a communication line to the MCH. For example, DIMM1 1001 is coupled to VccDDR1 via DIMM1 power node 1051, is coupled to MCH 950 via DIMM1 MCH communication coupling 1061, is coupled at VrefM1 node 934 to VrefM 955 via VrefM1 coupling 1071 and VrefM coupling 1048. DIMM2 1002 is coupled to VccDDR2 960 via DIMM2 power node 1052, is coupled to MCH 950 via DIMM2 MCH communication coupling 1062, and is coupled at VrefM2 node 984 to VrefM 955 via VrefM2 node coupling 1072 and VrefM coupling 1048.

For example, in embodiments, communication coupling 1061 may communicate data from DIMM1 1001 to MCH 950, and from MCH 950 to DIMM1 1001. Similarly, in embodiments, communication coupling 1062 may communicate data from DIMM2 1002 to MCH 950, and from MCH 950 to DIMM2 1002.

Each of DIMM3 1003, DIMM5 1005, and DIMM7 1007 is coupled to VccDDR1 910, MCH 950, and VrefM 955 via nodes 1083, 1085, and 1087; couplings 1063, 1065, and 1067; and couplings 1073, 1075, and 1077, similarly to corresponding nodes and couplings described above with respect to DIMM1 1001. Consequently, DIMM4 1004, DIMM6 1006, and DIMM8 1008 are likewise correspondingly coupled to VccDDR2 960, MCH 950, and VrefM 955 correspondingly to nodes and couplings described above with respect to DIMM2 1002. Moreover, according to embodiments, couplings 1071 to 1078, and 1061 to 1068 may include various appropriate electronic couplings such as described above with respect to coupling 1040.

Thus, FIG. 10 describes an embodiment for a dual channel memory subsystem wherein the first memory channel includes DIMM1, 3, 5, and 7 powered from VccDDR1 power plane 910 as connected and disconnected at switch "S1" 1038 from VccMCH (e.g., VccMCH1 and/or VccMCH2). Likewise, a second channel memory channel includes DIMM2, 4, 6 and 8 powered by VccDDR power plane 960 as connected and disconnected via switch "S2" 1039 from VccMCH (e.g., VccMCH1 and VccMCH2). Likewise, each of the two memory channels receive reference voltage 955 from the MCH and provides a reference voltage (e.g., voltage 922 and voltage 972) to the MCH. Additionally, each DIMM is coupled to the MCH via a communication coupling which may include one or more couplings as described above with respect to coupling 1040 for providing control signals from MCH 952 DIMM, and for providing data from the DIMM to the MCH. Thus, control signals from MCH 950 received at each DIMM may be interpreted in accordance with VrefM 955 as described herein, and data provided by each DIMM to MCH 950 may be interpreted according to Vref1 922 or Vref2 972 as appropriate for that DIMM (e.g., as corresponding to whether that DIMM is powered from VccDDR1 or VccDDR2) as described herein.

Figure 11:
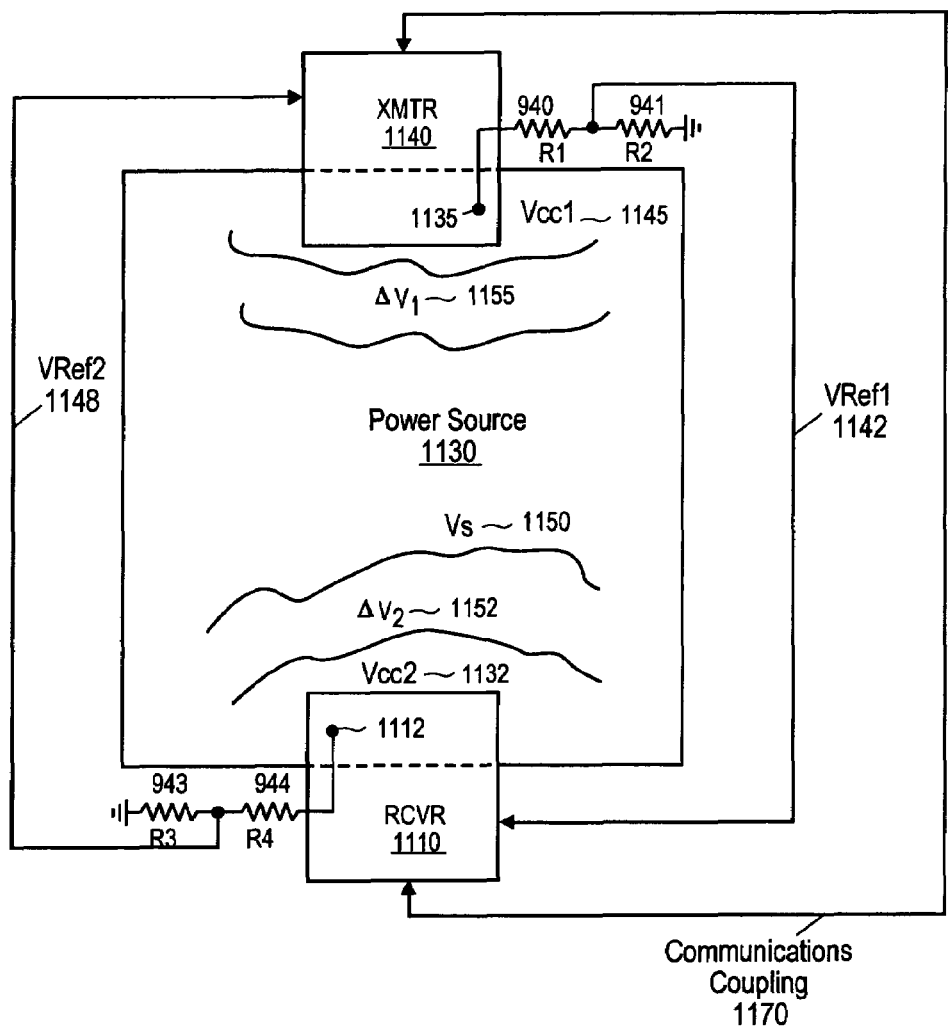
FIG. 11 is a reference voltage system block diagram having one power source for powering a data transmitter and a data receiver, in accordance with one embodiment of the invention.

According to embodiments, reference voltages (e.g., such voltages 125, 175, and 155 as shown in FIG. 1) may be used in various data transmission circuitry having a data transmitter power voltage that vary independently with time as compared to the power source voltage of the data receiver. Such circuitry includes computer memory systems, computer memory subsystems, cache memory, DDRSDRAM, and other memory described above with respect to module 130. For example, FIG. 11 is a reference voltage system block diagram having one power source for powering a data transmitter and a data receiver, in accordance with one embodiment of the invention. FIG. 11 shows power source 1130 coupled to first node 1135 and second node 1112. First node 1135 supplies or provides a first voltage used to generate Vref1 1142 via $R_1$ 940 and $R_2$ 941. Node 1135 also receives power from source 1130 for powering first data transmitter 1140. In embodiments, transmitter 1140 may be a memory module such as module 130 or an MCH such as module 150.

Similarly, node 1112 supplies or provides a voltage used to generate voltage Vref2 1148 via $R_3$ 943 and $R_4$ 944. Node 1112 also provides power from source 1130 to power data receiver 1110. According to embodiments, data receiver 1110 may be a module such as module 150 or module 130. Transmitter 1140 is also coupled to receiver 1110 via communication coupling 1170. Coupling 1170 may be a communication coupling such as coupling 1061.

Source 1130 provides voltage Vcc1 1145 that may be a different voltage than source voltage Vs 1150 due to delta $\Delta$V1 1155. $\Delta$V1 1155 may be the result of a voltage drop or droop associated with electronic circuitry between source voltage 1150 and voltage 1145. For example, $\Delta$V1 1115 may be losses resulting from electronic components of transmitter 1140 and/or receiver 1110 consuming power from source 1130 at nodes 1135 and 1112, as well as losses due to circuitry such as described above with respect to signal 510, power couplings such as described with respect to coupling 116, or signal coupling such as described with respect to coupling 122 associated with transmitter 1140 and receiver 1110. Similarly, source 1130 provides Vcc2 1132 to node 1112 which may be a different voltage than Vs 1150 due to $\Delta$V2 1152. $\Delta$V2 1152 may be the result of a voltage drop or droop associated with or resulting from situations similar to those described above with respect to $\Delta$V1 1155. However, in embodiments, $\Delta$V1 1155 is not equal to $\Delta$V2 1152.

Moreover, according to embodiments, source 1130 may be circuit board power plane for other electronic component that experiences voltage $\Delta$ such as drop or droop in voltage due to current, resistance, inductance, capacitance, temperature, power loss, voltage loss, or other electronic circuit and electrical phenomena that results in a different voltage that Vcc1 1145 as compared to Vcc2 1132. Specifically, for instance, source 1130 may be a circuit board power plane experiencing voltage delta at $\Delta$1155 and/or 1152 resulting from a current/resistance loss across the power plane.

Thus, in embodiments, receiver 1110 may ensure proper interpretation of data received via coupling 1170 from transmitter 1140 and/or may correct for voltage difference between voltage 1145 and voltage 1132 because receiver 1110 is coupled to receive Vref1 1142. Finally, such proper interpretation may be insured by comparing voltage 1142 with voltage received on coupling 1170 such as using a differential input buffer to discern whether a voltage received via coupling 1170 is greater than voltage 1142 (e.g., thus resulting in a logical "1") or is less than voltage 1142 (e.g., resulting in a logical "0").

The invention is described with reference to specific embodiments thereof. However, it will be evident that various modifications and changes may be made thereto without departing from the broader spirit and scope of the invention as set forth in the claims. The specification and drawings are, accordingly, to be regarded in an illustrative rather than a restrictive sense.

What is claimed:

1. An apparatus comprising:
a first power source node to receive a first voltage from a first power source;
a first reference voltage generator to generate a first reference voltage when the first voltage is applied to the first power source node;
a first data transmitter module coupled to receive power from the first power source node; and
a data receiver module coupled to receive data from the first data transmitter module and coupled to the first reference voltage generator to ensure proper interpretation of the data received from the first data transmitter module.

2. The apparatus of claim 1, wherein the first data transmitter module includes a first data storage unit and the data receiver module includes a controller for controlling the first data storage unit.

3. The apparatus of claim 2, wherein the amplitude of the first reference voltage is on the order of approximately one half the amplitude of the first voltage.

4. The apparatus of claim 1, wherein the data receiver module includes a first data storage unit and the first data transmitter module includes a controller for controlling the first data storage unit.

5. The apparatus of claim 1, wherein a voltage amplitude of the first reference voltage is proportional with a voltage amplitude of the first voltage over time.

6. The apparatus of claim 1, wherein a voltage amplitude of the data from the first data transmitter tracks a voltage amplitude of the first voltage with time.

7. The apparatus of claim 1, wherein the first power source is a first power supply.

8. The apparatus of claim 1, wherein the first reference voltage generator comprises one of a passive circuit, a voltage divider, and a plurality of resistors.

9. The apparatus of claim 1, wherein the data receiver module includes one of a differential input buffer and a voltage comparator circuit to compare a voltage amplitude of the data received from the first data transmitter module to a voltage amplitude of the first reference voltage.

10. The apparatus of claim 1, wherein the data receiver module includes a comparator module to interpret whether a voltage amplitude of the data received from the first data transmitter module over a period of time is greater or less than a voltage amplitude of the first reference voltage over the period of time.

11. An apparatus comprising:
a first power source node to receive a first voltage from a first power source;
a first reference voltage generator to generate a first reference voltage when the first voltage is applied to the first power source node;
a first memory module coupled to receive power from the first power source node;
a controller power source node to receive a controller voltage from a controller power source; and a memory controller module coupled to receive power from the controller power source node and coupled to the first reference voltage generator to correct for voltage difference between the first power source and the controller power source.

12. The apparatus of claim 11, further comprising:
a second power source node to receive a second voltage from a second power source;
a second reference voltage generator to generate a second reference voltage when the second voltage is applied to the second power source node, the memory controller module coupled to the second reference voltage generator to correct for voltage difference between the second power source and the controller power source; and
a second memory module coupled to receive power from the second power source node.

13. The apparatus of claim 12, wherein the first memory module is coupled to a controller reference voltage generator to correct for voltage difference between the controller power source and the first power source;
the second memory module is coupled to the controller reference voltage generator to correct for voltage difference between the controller power source and the second power source;
the apparatus further comprising:
the controller reference voltage generator to generate a controller reference voltage when the controller voltage is applied to the controller power source node.

14. The apparatus of claim 13, further comprising:
a first data transmitter to transmit first data to the memory controller module, the first data to depend on the first power source;
a second data transmitter to transmit second data to the memory controller module, the second data to depend on the second power source;
a first control signal transmitter to transmit a first control signal to the first memory module, the first control signal to depend on the controller power source; and
a second control signal transmitter to transmit a second control signal to the second memory module, the second control signal to depend on the controller power source.

15. The apparatus of claim 14, wherein the first data depends on the controller reference voltage; wherein the second data depends on the controller reference voltage; wherein the first control signal depends on the first reference voltage; and wherein the second control signal depends on the second reference voltage.

16. The apparatus of claim 13, wherein the first memory module and the second memory module include double data rate synchronous dynamic random access memory (RAM), and the memory controller module includes memory controller for controlling the first and second memory modules.

17. The apparatus of claim 13, wherein the first memory module and the second memory module each include at least one dual in-line memory module.

18. The apparatus of claim 12, wherein the first power source is a first power supply, the controller power source is a controller power supply, and the second power source is a second power supply.

19. The apparatus of claim 11, wherein the first voltage, the second voltage, and the controller voltage are independent voltages in a range between 1.5 and 2.9 volts.

20. The apparatus of claim 11, wherein the first, second, and controller power sources all receive power from a common supply of power.

21. The apparatus of claim 20, wherein the common supply of power comprises a circuit board power plane.

22. The apparatus of claim 21, further comprising:
a first switch and a first a circuit board trace coupling the power plane to the first power source node, the first switch to electrically connect and disconnect the power plane to the first power source node; and
a second switch and a second a circuit board trace coupling the power plane to the second power source node, the second switch to electrically connect and disconnect the power plane to the second power source node.

23. A method comprising:
powering a first memory module with a first power source voltage;
generating a first reference voltage from the first power source voltage;
powering a memory controller module with a controller power source voltage; and
correcting for voltage difference between the first power source voltage and the controller power source voltage.

24. The method of claim 23, further comprising:
powering a second memory module with a second power source voltage;
generating a second reference voltage from the second power source voltage; and
correcting for voltage difference between the second power source voltage and the controller power source voltage.

25. The method of claim 23, further comprising:
generating a controller reference voltage from the controller power source voltage; and
correcting for voltage difference between the controller power source voltage and the first power source voltage.

26. The method of claim 25, further comprising:
transmitting a first data to the memory controller module, the first data depending on the first power source voltage; and
transmitting a first control signal to the first memory module, the first control signal depending on the controller power source voltage.

27. The method of claim 26, further comprising:
controlling the first memory module according to the first control signal.

28. The method of claim 26, wherein:
correcting for voltage difference between the first power source voltage and the controller power source voltage comprises comparing the first data to the first reference voltage; and
correcting for voltage difference between the controller power source voltage and the first power source voltage comprises comparing the first control signal to the controller reference voltage.

29. The method of claim 28, wherein comparing the first data to the first reference voltage comprises:
interpreting a period over time of the first data as an active signal if a voltage amplitude of the first data is on the average greater than a voltage amplitude of the first reference voltage over the period of time; and
interpreting a period over time of the first data as an inactive signal if the voltage amplitude of the first data is on the average less than the voltage amplitude of the first reference voltage over the period of time; comparing the first control signal to the controller reference voltage comprises:

interpreting a period over time of the first control signal as an active signal if a voltage amplitude of the first control signal is on the average greater than a voltage amplitude of the controller reference voltage over the period of time; and interpreting a period over time of the first control signal as an inactive signal if the voltage amplitude of the first control signal is on the average less than the voltage amplitude of the controller reference voltage over the period of time.

30. The method of claim 25, further comprising:

transmitting a first data to the memory controller module, the first data depending on the first power source voltage; and transmitting a second data to the first memory module, the second data depending on the controller power source voltage.

31. A system comprising:

a first power supply to apply a first voltage to a first power source node;

a first reference voltage generator to generate a first reference voltage when the first voltage is applied to the first power source node;

a first memory module coupled to receive power from the first power source node;

a controller power supply to apply a controller voltage to a controller power source node; and a memory controller module coupled to receive power from the controller power source node and coupled to the first reference voltage generator to correct for voltage difference between the first power supply and the controller power supply.

32. The system of claim 31, wherein the first memory module is coupled to a controller reference voltage generator to correct for voltage difference between the controller power supply and the first power supply;

the apparatus further comprising:

the controller reference voltage generator to generate a controller reference voltage when the controller voltage is applied to the controller power source node.

33. The system of claim 31, wherein a voltage amplitude of the first reference voltage is proportional with a voltage amplitude of the first voltage over time.

34. The system of claim 31, wherein correcting for a voltage difference between the first power supply and the controller power supply comprises:

comparing the first reference voltage to data received from the first memory module.

\* \* \* \* \*